United States Patent
Aronowitz et al.

(10) Patent No.: US 6,413,881 B1
(45) Date of Patent: Jul. 2, 2002

(54) PROCESS FOR FORMING THIN GATE OXIDE WITH ENHANCED RELIABILITY BY NITRIDATION OF UPPER SURFACE OF GATE OF OXIDE TO FORM BARRIER OF NITROGEN ATOMS IN UPPER SURFACE REGION OF GATE OXIDE, AND RESULTING PRODUCT

(75) Inventors: Sheldon Aronowitz, San Jose; John Haywood, Santa Clara; James P. Kimball, San Jose; Helmut Puchner, Santa Clara; Ravindra Manohar Kapre; Nicholas Eib, both of San Jose, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/521,312

(22) Filed: Mar. 9, 2000

(51) Int. Cl.[7] ................................................ H01L 21/31
(52) U.S. Cl. ........................ 438/775; 438/776; 438/777
(58) Field of Search ................................ 438/775, 776, 438/777, 981, 786, 769, 791, 792, 513, 977

(56) References Cited

U.S. PATENT DOCUMENTS

| | | | | |
|---|---|---|---|---|
| 4,900,396 A | * | 2/1990 | Hayashi et al. | 438/705 |
| 5,763,922 A | * | 6/1998 | Chau | 257/371 |
| 5,872,376 A | * | 2/1999 | Gardner et al. | 257/336 |
| 5,891,798 A | * | 4/1999 | Doyle et al. | 438/624 |
| 6,048,769 A | * | 4/2000 | Chau | 438/275 |
| 6,080,682 A | * | 6/2000 | Ibok | 438/770 |
| 6,110,842 A | * | 8/2000 | Okuno et al. | 438/776 |
| 6,136,654 A | * | 10/2000 | Kraft et al. | 438/287 |
| 6,258,673 B1 | * | 7/2001 | Houlihan et al. | 438/275 |
| 6,265,327 B1 | * | 7/2001 | Kobayashi et al. | 438/776 |

FOREIGN PATENT DOCUMENTS

| | | | | |
|---|---|---|---|---|
| JP | 10-074944 | * | 3/1998 | H01L/29/78 |
| JP | 10-173187 | * | 6/1998 | H01L/29/78 |
| WO | WO 97/28560 | * | 8/1997 | H01L/21/28 |

* cited by examiner

*Primary Examiner*—Eddie Lee
*Assistant Examiner*—José R Díaz
(74) *Attorney, Agent, or Firm*—John Taylor

(57) ABSTRACT

A process for inhibiting the passage of dopant from a gate electrode into a thin gate oxide comprises nitridation of the upper surface of the thin gate oxide, prior to formation of the gate electrode over the gate oxide, to thereby form a barrier of nitrogen atoms in the upper surface region of the gate oxide adjacent the interface between the gate oxide and the gate electrode to inhibit passage of dopant atoms from the gate electrode into the thin gate oxide during annealing of the structure. In one embodiment, a selective portion of silicon oxide on a silicon substrate may be etched to thin the oxide to the desired thickness using a nitrogen plasma with a bias applied to the silicon substrate. Nitridation of the surface of the etched silicon oxide is then carried out in the same apparatus by removing the bias from the silicon substrate.

10 Claims, 3 Drawing Sheets

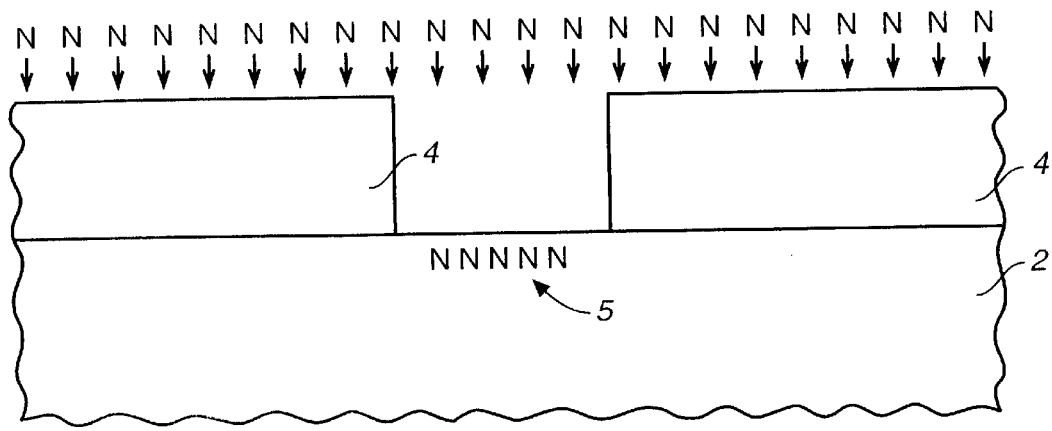
FIG._1 (PRIOR ART)
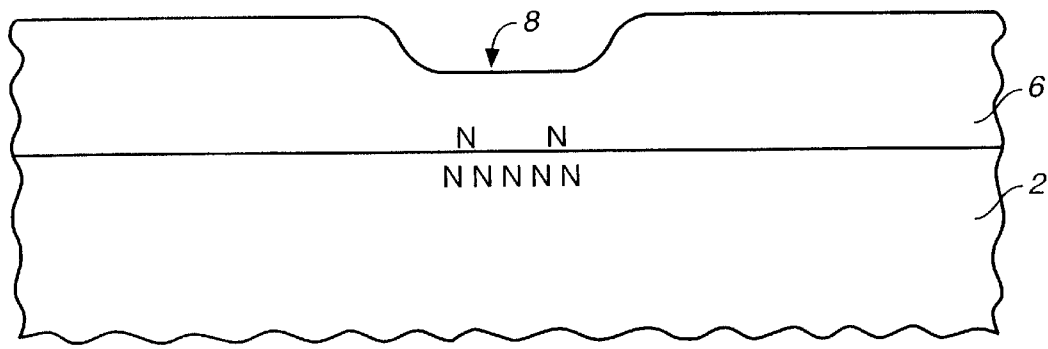
FIG._2 (PRIOR ART)
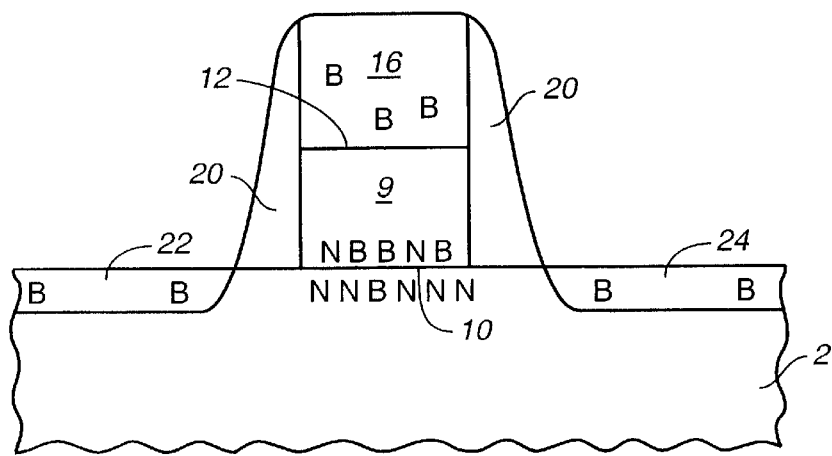
FIG._3 (PRIOR ART)

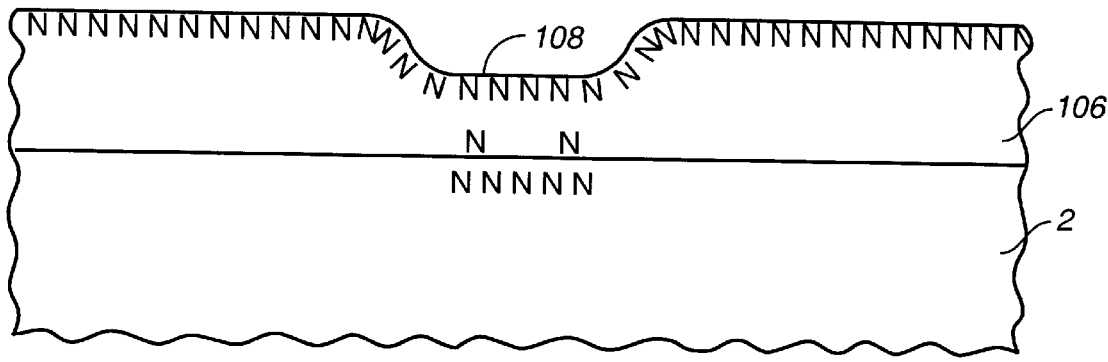
FIG._4
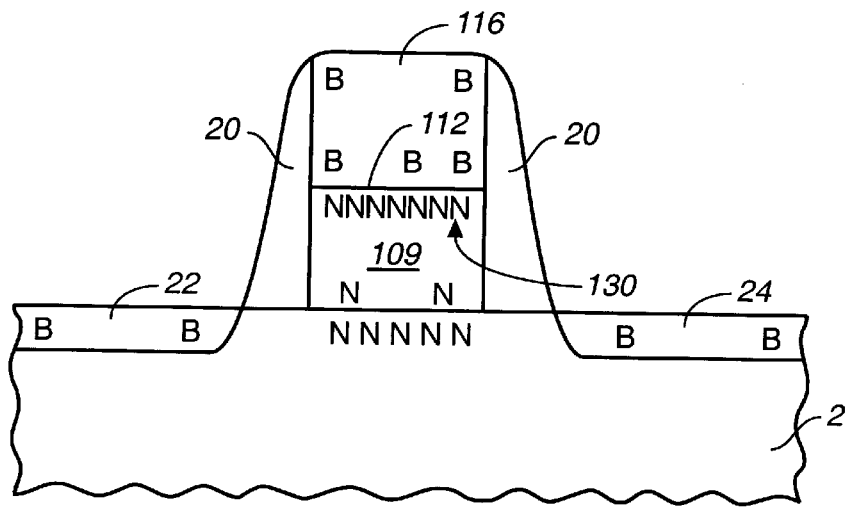
FIG._5 *(PRIOR ART)*

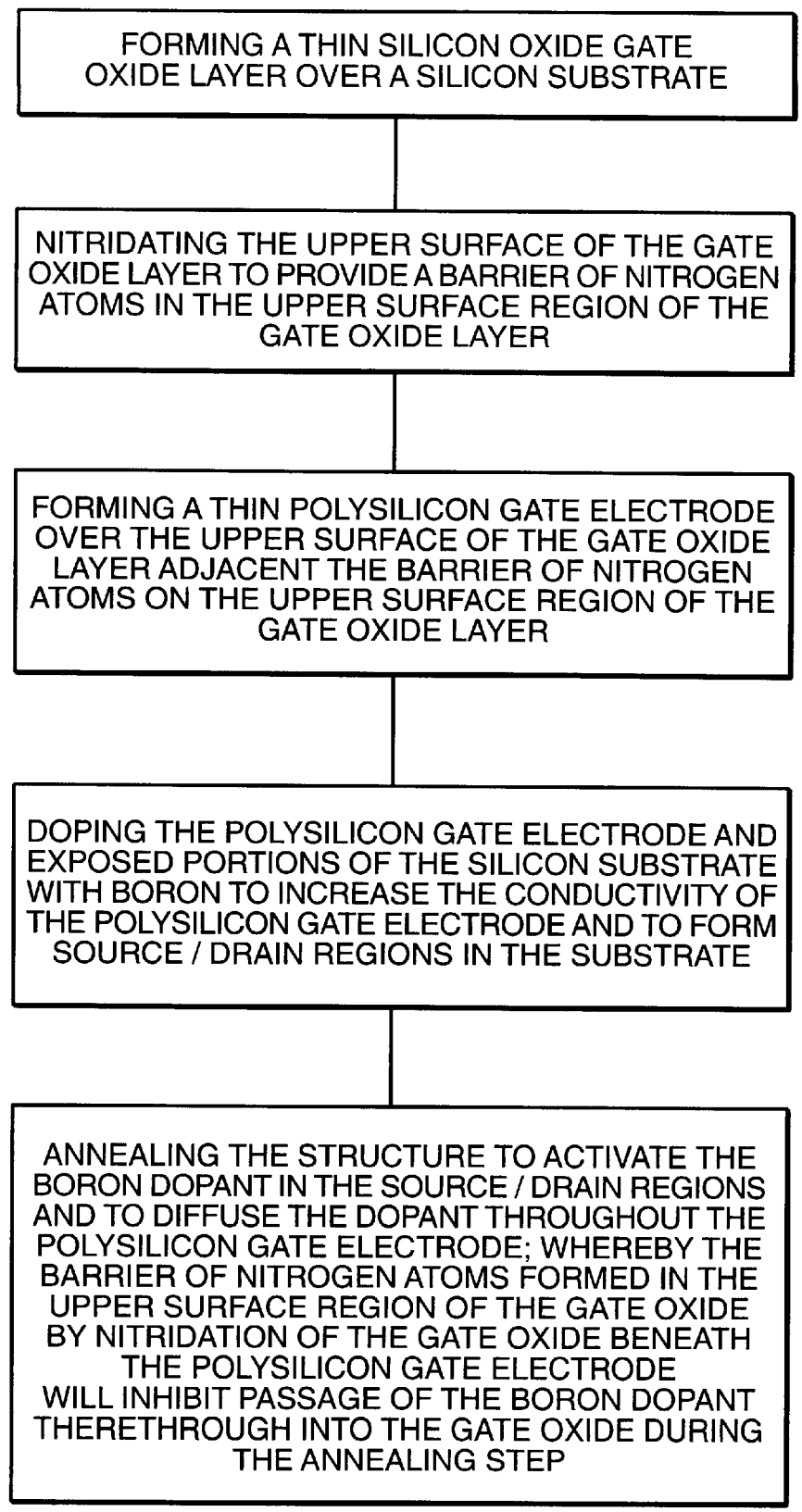
FIG._6

PROCESS FOR FORMING THIN GATE OXIDE WITH ENHANCED RELIABILITY BY NITRIDATION OF UPPER SURFACE OF GATE OF OXIDE TO FORM BARRIER OF NITROGEN ATOMS IN UPPER SURFACE REGION OF GATE OXIDE, AND RESULTING PRODUCT

BACKGROUND OF THE INVENTION

1. Field of the Invention

This invention relates to a process for forming thin gate oxide of enhanced reliability for MOS devices of integrated circuit structures, and the resulting product. More particularly, this invention relates to a product and a process for forming the product by forming a dopant barrier of nitrogen atoms in the upper surface region of a thin gate oxide beneath a thin polysilicon gate electrode by nitridation of the upper surface of the thin gate oxide whereby minimization of gate depletion and enhanced device performance may be maintained by the provision of a thin polysilicon gate electrode and a thin gate oxide while inhibiting penetration of gate electrode dopant into the gate oxide or the underlying channel region of the MOS device in the semiconductor substrate.

2. Description of the Related Art

As integrated circuit structures have continued to shrink in size of individual components, it has become necessary to accurately control the thickness of materials such as silicon oxide and polysilicon formed on the integrated circuit structures. For example, formation of an MOS transistor may require the formation of a high quality gate oxide of less than 4.0 nanometers (nm) in thickness, and a thin polysilicon gate electrode thereon of less than 300 nm. The use of such thin polysilicon gate electrodes provides a remedy for gate depletion, while enhanced performance of the resulting MOS devices results from the provision of both thin gate oxides and thin polysilicon gate electrodes.

However, since a polysilicon gate electrode requires doping to provide the desired electrical conductivity of the electrode, the problem of penetration of the polysilicon gate dopant into the underlying gate oxide and the channel region of the semiconductor substrate beneath the gate oxide is exacerbated when such thin gate oxides and thin polysilicon gate electrodes are utilized.

Implantation of nitrogen into a silicon substrate to control the thickness of a silicon oxide layer subsequently grown thereon has been previously demonstrated in the literature. As shown in prior art FIG. 1, a silicon substrate 2 can be masked by a resist mask 4 to expose only that portion of substrate 2 where it is desired to subsequently grow a thin oxide. The masked structure is then subject to a blanket implantation of nitrogen resulting in nitrogen atoms implanted into the exposed silicon substrate surface, as shown at 5 in FIG. 1. Removal of mask 4 thereafter followed by growth of a silicon oxide layer 6 will result in a thin silicon oxide region 8 formed in the portion of silicon oxide layer 6 grown over nitrogen implanted region 5 of silicon substrate 2, as shown in prior art FIG. 2.

Thin oxide region 8 of oxide layer 6 is then utilized as the thin gate oxide of an MOS device by depositing a thin polysilicon layer over silicon oxide layer 6 and then patterning both the polysilicon layer and the underlying oxide layer 6 to form a thin polysilicon gate electrode 16 over thin gate oxide 9 formed from thin silicon oxide portion 8 of silicon oxide layer 6, as shown in FIG. 3. Insulating sidewall spacers 20 are then conventionally formed on the sidewalls of polysilicon gate electrode 16, followed by implantation with a dopant (such as boron when a PMOS device is to be constructed, or phosphorus or arsenic when an NMOS device is being constructed) to both dope gate electrode 16 and to form source/drain regions 22 and 24 in silicon substrate 2.

When the structure is then annealed to activate the dopant, the mobility of the dopant atoms (particularly boron atoms) and the thinness of both the thin polysilicon gate electrode and the thin gate oxide can result in migration of the dopant atoms such as boron atoms through the thin polysilicon gate into the underlying gate oxide, as well as through the thin gate oxide into the region of the silicon substrate beneath the gate oxide where the channel of the MOS device will be formed.

While the previous nitrogen implantation of the silicon substrate (to control the thickness of the silicon oxide layer grown in the nitrogen-implanted surface of the silicon substrate) also provides some barrier protection against penetration of the dopant atoms into the channel region of the silicon substrate, the amount of such implanted nitrogen incorporated into the thin oxide subsequently grown over and in the implanted substrate does not exceed a concentration of several atomic percent. Furthermore, the nitrogen incorporated into the oxide is incorporated into the region near substrate/oxide interface 10 (not oxide/polysilicon interface 12). Consequently, as shown in prior art FIG. 3, any dopant atoms diffusing from the polysilicon gate electrode into the gate oxide can diffuse through the gate oxide and will pile up in the gate oxide near this lower interface, thereby degrading the gate oxide reliability.

Therefore, it would be desirable to provide a process which would form a barrier against penetration of gate electrode dopant into either the underlying thin gate oxide or the channel region of the silicon substrate beneath the gate oxide, while still permitting the formation and use of thin silicon oxide gate oxides and thin polysilicon gate electrodes to provide the desired gate depletion protection and enhanced device performance.

SUMMARY OF THE INVENTION

The invention comprises a process for inhibiting the passage of dopant from a thin polysilicon gate electrode into a thin gate oxide beneath the gate electrode, and thereby also inhibiting the further passage of such dopant through the thin gate oxide into the channel region of a silicon substrate beneath the gate oxide. The process comprises nitridation of the upper surface region of the thin gate oxide prior to formation of the thin polysilicon gate electrode over the nitridated surface of the gate oxide to thereby form a barrier of nitrogen atoms in the upper surface region of the gate oxide adjacent the interface between the gate electrode and the gate oxide to inhibit passage of dopant atoms in the polysilicon gate electrode into the gate oxide, or through the gate oxide into the channel region of the silicon substrate beneath the gate oxide during subsequent annealing of the structure.

In one embodiment, a thin gate oxide is first formed over the silicon substrate by implanting nitrogen atoms into the surface of the silicon substrate in the region where the silicon oxide will be formed over. Subsequent growth of a silicon oxide layer will result in the formation of thin silicon oxide in the nitrogen-implanted surface region of the silicon substrate. At least some of the implanted nitrogen atoms in the silicon substrate surface will then be incorporated into the thin gate oxide to thereby supplement the dopant barrier formed by the nitrogen atoms present in the upper surface region of the gate oxide layer due to the nitridation step of the invention.

In another embodiment, a selective portion of a silicon oxide layer on a silicon substrate may be selectively etched to thin the oxide to the desired thickness for a subsequently formed gate oxide. Such etching of the silicon oxide may be carried out using a nitrogen plasma with a bias applied to the silicon substrate, in which case nitridation of the surface of the etched silicon oxide may be carried out in the same apparatus, after the desired thickness of the silicon oxide layer is achieved, by removing the bias from the silicon substrate.

BRIEF DESCRIPTION OF THE DRAWINGS

FIG. 1 is a fragmentary vertical cross-sectional view of a prior art silicon substrate showing selective implantation of nitrogen into an unmasked portion of the silicon substrate.

FIG. 2 is a fragmentary vertical cross-sectional view of the nitrogen-implanted prior art structure of FIG. 1 after removal of the mask and growth of a silicon oxide layer on the silicon substrate, with a thin silicon oxide portion of the oxide layer formed over the nitrogen-implanted portion of the substrate.

FIG. 3 is a fragmentary vertical cross-sectional view of the prior art structure of FIG. 2 after formation of a polysilicon gate electrode over a thin gate oxide formed from the thin portion of the previously formed oxide layer, showing blanket implantation of the structure with boron dopant.

FIG. 4 is a fragmentary vertical cross-sectional view of a selectively nitrogen-implanted silicon substrate having a silicon oxide layer with a thin region formed thereon, as in FIG. 2, but with the surface of the oxide layer subjected to a nitridation in accordance with the invention.

FIG. 5 is a fragmentary vertical cross-sectional view of the structure of FIG. 4 after formation of a polysilicon gate electrode over a thin gate oxide formed from the thin portion of the previously formed oxide layer, showing blanket implantation of the structure with boron dopant, and showing the dopant barrier formed at the junction between the polysilicon gate electrode and the gate oxide in accordance with the invention.

FIG. 6 is a flow sheet illustrating the process of the invention.

DETAILED DESCRIPTION OF THE INVENTION

The invention comprises a process for inhibiting the passage of dopant from a thin polysilicon gate electrode into a thin gate oxide beneath the gate electrode or through the gate oxide into the channel region of a silicon substrate beneath the gate oxide. The process comprises nitridation of the upper surface region of the gate oxide prior to formation of the thin polysilicon gate electrode over the nitridated surface of the gate oxide to thereby form a barrier of nitrogen atoms in the upper surface region of the gate oxide adjacent the interface between the gate oxide and the gate electrode to inhibit passage of dopant atoms from the polysilicon gate electrode into the gate oxide or the channel region of the silicon substrate beneath the gate oxide during annealing of the structure.

In one embodiment, a thin gate oxide is first formed over the silicon substrate by implanting nitrogen atoms into the surface of the silicon substrate in the region where the silicon oxide will be formed over. Subsequent growth of a silicon oxide layer will result in the formation of thin silicon oxide in the nitrogen-implanted surface region of the silicon substrate. At least some of the implanted nitrogen atoms in the silicon substrate surface will then be incorporated into the thin gate oxide to thereby supplement the dopant barrier formed by the nitrogen atoms present in the upper surface region of the gate oxide layer due to the nitridation step.

In another embodiment, a selective portion of a silicon oxide layer on a silicon substrate may be selectively etched to thin the oxide to the desired thickness for a subsequently formed gate oxide. Such etching of the silicon oxide may be carried out using a nitrogen plasma with a bias applied to the silicon substrate, in which case nitridation of the surface of the etched silicon oxide may be carried out in the same apparatus, after the desired thickness of the silicon oxide layer is achieved, by removing the bias from the silicon substrate.

By use of the term "thin gate oxide" is meant a silicon oxide gate oxide having a thickness of less than 10 nm. By use of the term "thin gate electrode" is meant a polysilicon gate electrode having a thickness of less than 300 nm.

By use of the term "upper surface region", with respect to the portion of the gate oxide layer nitridated to form the barrier of nitrogen atoms, is meant a region extending from the upper surface of the gate oxide downward therein for a distance not exceeding the full thickness of the gate oxide layer.

a. Formation of Thin Gate Oxide

The thin gate oxide used in the practice of the invention may be formed, in one embodiment, by first implanting with nitrogen atoms the surface region of an unmasked portion of a silicon substrate where subsequent formation of the thin gate oxide is desired, as shown by the nitrogen atoms implanted in the surface of silicon substrate 2 in FIG. 4. The implantation may be carried out at a dosage concentration of about $5 \times 10^{14}$ atoms/cm$^2$ and an energy level of from about 20 to about 30 Kev. Silicon oxide layer 106 is then grown over substrate 2, including the implanted region, resulting in growth of a thick silicon oxide in portions of the silicon substrate not implanted with nitrogen and a thinner silicon oxide at 108 where the implanted nitrogen is present. By adjusting the time of the oxide growth, a thin oxide having a thickness less than 2.5 nm may be grown over the nitrogen-implanted portions of the silicon substrate, while thicker oxide is grown elsewhere, for example, for analog applications. The formation of the thin gate oxide by this method has the advantage that some of the nitrogen implanted into the silicon substrate will be incorporated into the subsequently grown gate oxide to provide some supplemental protection against migration of the gate electrode dopant through the gate oxide into the channel portion of the silicon substrate beneath the thin gate oxide.

The desired thin silicon oxide may also be formed by initial formation of a blanket layer of silicon oxide over the silicon substrate followed by either selective or blanket etching of the silicon oxide layer with a nitrogen plasma, while maintaining a selected electrical bias on the silicon substrate, to achieve the desired thickness of the silicon oxide layer. This method of forming the desired thin gate oxide has the advantage that the same nitrogen plasma apparatus used to etch the silicon oxide may also be used for nitridation of the surface of the resulting thin silicon oxide to be utilized as a gate oxide beneath the subsequently formed polysilicon gate electrode. This process for controlled etching of silicon oxide using a selected bias on the underlying silicon substrate to control the amount of oxide removed is described in more detail in copending application Ser. No. 09/464,297, filed by us with another on Dec. 15, 1999, and entitled "PROCESS FOR ETCHING A CONTROLLABLE THICKNESS OF OXIDE ON AN INTEGRATED CIRCUIT STRUCTURE ON A SEMICONDUCTOR SUBSTRATE USING NITROGEN PLASMA AND AN RF BIAS APPLIED TO THE SUBSTRATE", assigned to the assignee of this invention, and the subject matter of which is hereby incorporated herein.

b. Nitridation

After formation of the thin silicon oxide layer portion on the silicon substrate where the MOS device will be subsequently constructed, the thin oxide is nitridated, in accordance with the invention as shown in FIG. 4, by exposing the silicon oxide surface to a nitrogen plasma, preferably a remote plasma, in a vacuum chamber while maintaining a zero bias on the silicon substrate (to avoid etching of the thin silicon oxide) to thereby provide a dopant barrier of nitrogen atoms in the upper surface region of thin portion 108 of oxide layer 106 adjacent surface 112 which will become the interface between the gate oxide and the polysilicon gate electrode to be constructed thereon.

The nitridation is carried out for a time period ranging from a minimum of about 2 seconds up to a period of about 10 minutes. Preferably the nitridation time will range from about 5 seconds to about 1 minute, with 10 seconds being a typical time period for the nitridation.

The nitridation process is carried out while maintaining a pressure within the vacuum chamber sufficient to permit maintenance of a plasma in the vacuum chamber, yet low enough to avoid damage to the system and to maintain the pressure within the capabilities of the system. Preferably, the pressure will be maintained within a range of from about 1 millitorr to about 1000 millitorr, and most preferably from about 1 millitorr to about 500 millitorr, with pressures ranging from about 1 millitorr to about 100 millitorr being typical. Maintaining the pressure in the vacuum chamber within these ranges will usually satisfy the above criteria. The flow of the gaseous source of nitrogen into the chamber will be related to the desired pressure maintained within the chamber and the pumping speed of the apparatus.

The nitrogen plasma in the vacuum chamber is established by flowing a gaseous source of nitrogen, such as $N_2$, or another nitrogen-containing gas such as $N_2O$ or NO, into the etch apparatus and igniting the plasma, using an rf plasma power source maintained within a power range of from a minimum power capable of maintaining the plasma in the vacuum chamber up to a maximum power level which will not damage either the equipment or the substrate. Maintaining the plasma power source within a power range of from about 250 watts to about 2000 watts will satisfy these criteria.

The temperature at which the nitridation is carried out is not considered to be crucial, except that maximum temperatures should be below temperatures which might damage the vacuum apparatus or other portions of the integrated circuit structure on the semiconductor substrate. Temperatures below about 250° C. should be sufficient from a standpoint of equipment damage. However, lower maximum temperatures, such as 60° C. or less, may be preferable from a standpoint of damage to the integrated circuit structure, such as resist masks present on the structure during the nitridation. Thermal budget requirements may also favor the use of lower maximum temperatures during the nitridation.

In any event, for preserving the reproducible characteristics of the nitridation, it is preferable that a single operating temperature within the above considerations be selected for conduct of the nitridation process.

By use of the term "remote plasma" is meant a plasma which is generated at a distance from the substrate target sufficiently far enough from the plasma origin that recombination of at least some of the electrons with the ionic nitrogen species occurs so that the flux of ionic species will be reduced from the initial flux created at the plasma's origin. Plasma apparatus having such remote plasma generation capabilities are commercially available, such as, for example, a LAM 9400SE Transformer Coupled Plasma (TCP) reactor or an Applied Materials DPS reactor.

c. Formation of Thin Gate Electrode

After formation of the thin silicon oxide which will serve as the gate oxide of the MOS device to b constructed, and the nitridation of the surface of this thin silicon oxide, the thin polysilicon gate electrode 116 shown in FIG. 5 is formed by first depositing a blanket layer of polysilicon over the nitridated oxide layer 106 of FIG. 4. This deposited polysilicon layer may either be initially deposited to the desired thickness, or deposited as a thicker layer with portions of the polysilicon then removed such as by wet or dry etching or by chemical/mechanical polishing (CMP) to achieve the desired thickness of less than about 300 nm. The polysilicon layer is then masked and selectively etched, together with the underlying nitridated silicon oxide layer 106, to form the desired thin polysilicon gate electrode 116 over the thin silicon oxide gate oxide 109 formed from the thinned portion 108 of oxide layer 106. Oxide spacers 20 are then formed on the sidewalls of the polysilicon gate electrode by blanket deposit of an oxide layer followed by anisotropic etching of the blanket-deposited oxide layer, as is well known to those skilled in the art.

d. Implantation with Dopant Followed by Annealing

The structure is then implanted with dopant, as shown in FIG. 5, to dope polysilicon gate electrode 116 and to form the source/drain regions 22 and 24 in silicon substrate 2. While the process of the invention may be used with regard to the formation of a barrier layer of nitrogen atoms for any dopant, it finds particular utility with respect to the formation of PMOS devices wherein the dopant is boron, because of the high mobility of the boron dopant. For this reason, the dopant will be hereinafter referred to as a boron dopant by way of illustration and not of limitation.

After the boron dopant implantation, for example at a dosage of $3 \times 10^{15}$ atoms/cm$^2$ and an energy level of about 30 Kev, the structure can be annealed at a temperature of from about 800° C. to about 1000° C. for a period of from about 10 minutes to about 30 minutes to activate the implanted dopant in the source/drain regions and to allow the boron dopant to diffuse throughout the polysilicon gate electrode. Alternately, the structure can be subjected to a rapid thermal anneal (RTA) process at a temperature of from about 1000° C. to about 1050° C. for a period of from about 1 second to about 2 minutes, as is well known to those skilled in the art.

As shown in FIG. 5, in accordance with the invention, the boron dopant in polysilicon gate electrode 116 is inhibited from crossing interface 112 between gate electrode 116 and underlying gate oxide 109 by the presence of the nitrogen barrier 130 comprising the nitrogen atoms shown in the upper surface region of gate oxide 109 adjacent interface 112.

To further illustrate the practice of the process of the invention, a number of PMOS devices were constructed with nitridation of the gate oxide, as well as control devices constructed without the nitridation of the invention. Two types of PMOS devices were constructed, one rated as "High Performance" and the other as "Low Leakage". Long channel (10 µm) and short channel (0.21 µm) devices of each type were constructed. In each instance, the thickness of the thin gate oxide was 3.0 nm and the thickness of the thin polysilicon gate electrode was 200 nm.

Nitrogen was implanted in the silicon substrate of each sample to control the thickness of the oxide grown subsequently thereon to form the gate oxide. In each of the nitridated samples, the nitridation was carried out in a LAM 9400SE TCP remote plasma reactor in which the vacuum chamber was maintained at a pressure of 40 millitorr and a temperature of about 60° C., with the plasma generator power level maintained at about 500 watts. The source/drain regions of the control devices were annealed at 1000° C., while the source/drain regions of some of the PMOS devices constructed with the nitridation step of the invention were annealed at 1000° C. for 30 seconds and some at 1025° C. for 30 seconds, as indicated. For the devices with source/drain annealing at 1000° C., the nitridation step was carried out for 10 seconds, while the devices with source/drain annealing at 1025° C. were subject to a 20 second nitridation step. The threshold voltages (in millivolts) of the respective devices were tabulated as follows:

TABLE OF THRESHOLD VOLTAGES

| Device Type | Channel Length | Control (No Nitridation) | Nitridation with 1025° C. Anneal | Nitridation with 1025° C. Anneal |
|---|---|---|---|---|
| High Perform | Short | −272.4 | −335.7 | −344.0 |
| High Perform | Long | −235.8 | −317.5 | −346.7 |
| Low Leakage | Short | −396.1 | −449.2 | −459.2 |
| Low Leakage | Long | −343.5 | −416.7 | −444.9 |

The results show that the threshold voltage of each type of device, and at several annealing temperatures, is improved by the formation of the barrier of nitrogen atoms in the upper surface region of the thin gate oxide in accordance with the invention.

Thus, the invention provides a product and process for forming a barrier of nitrogen atoms in the upper surface region of a thin gate oxide of an MOS device, and particularly an PMOS device, by nitridation of the upper surface of the gate oxide. The barrier of nitrogen atoms formed in the upper surface region of the thin gate oxide inhibits the passage of dopant from a thin gate electrode into the thin gate oxide, as well as preventing the passage of dopant into the channel region of the substrate below the gate oxide, thus increasing the threshold voltage of MOS devices constructed with such a barrier of nitrogen atoms.

Having thus described the invention what is claimed is:

1. A process for forming an MOS device of an integrated circuit structure on a silicon substrate, said MOS device characterized by a thin gate oxide and a barrier of nitrogen atoms between said thin gate oxide and a thin polysilicon gate electrode of said MOS device to inhibit passage of dopant from said thin polysilicon gate electrode into said thin gate oxide which comprises:

a) growing a blanket layer of silicon oxide over a silicon substrate;

b) using a nitrogen plasma in a vacuum chamber to etch a thin gate oxide from an exposed portion of said blanket layer of silicon oxide by:
  i) introducing said silicon substrate into said vacuum chamber;
  ii) biasing said silicon substrate in said vacuum chamber;
  iii) flowing nitrogen into said vacuum chamber;
  iv) igniting a nitrogen plasma in said vacuum chamber while maintaining said flow of nitrogen into said vacuum chamber and while maintaining said bias on said silicon substrate to thereby etch said exposed portions of said blanket layer of silicon oxide; and
  v) removing said bias from said silicon substrate when sufficient silicon oxide has been etched from said blanket layer of silicon oxide to achieve the desired thickness of said thin gate oxide;

c) then, in the same vacuum chamber, nitridating an upper surface region of said thin gate oxide to form a barrier of nitrogen atoms in said upper surface region of said thin gate oxide by:
  i) flowing nitrogen into said vacuum chamber; and
  ii) maintaining a nitrogen plasma in said vacuum chamber while maintaining said flow of nitrogen into said vacuum chamber, but without maintaining a bias on said silicon substrate; and d) then extinguishing said nitrogen plasma used in said vacuum chamber both for forming said thin gate oxide and for nitridating said thin gate oxide;

e) forming a thin polysilicon gate electrode over said nitridated gate oxide;

f) doping said polysilicon gate electrode and exposed portions of said silicon substrate with dopant to increase the conductivity of said polysilicon gate electrode and to form source/drain regions in said silicon substrate; and g) annealing said silicon substrate to activate said dopant in said source/drain regions and to diffuse said dopant throughout said polysilicon gate electrode whereby said barrier of nitrogen atoms formed by said nitridation of said upper surface region of said thin gate oxide will inhibit passage of said dopant through said barrier of nitrogen atoms further into said thin gate oxide during said annealing;

wherein the same vacuum chamber and flow of nitrogen into said vacuum chambers are used for both the step of forming said thin gate oxide and the step of nitridating the upper surface of said thin gate oxide.

2. The process of claim 1 wherein said dopant is boron.

3. The process of claim 1 wherein said nitrogen plasma is maintained at a power level of from about 250 watts to about 1000 watts.

4. The process of claim 1 wherein said nitrogen plasma comprises a remote plasma.

5. The process of claim 1 wherein said nitridation process is carried out in said vacuum chamber while maintaining a pressure therein of from about 1 millitorr to about 1000 millitorr.

6. A process for forming an MOS device of an integrated circuit structure on a silicon substrate, said MOS device characterized by a thin gate oxide and a barrier of nitrogen atoms between said thin gate oxide and a thin polysilicon gate electrode of said MOS device to inhibit passage of dopant from said thin polysilicon gate electrode into said thin gate oxide which comprises:

a) growing a blanket layer of silicon oxide over said silicon substrate;
b) etching, with a nitrogen plasma in a vacuum chamber, a surface of an exposed portion of said blanket layer of silicon oxide to form a thin gate oxide by:
   i) introducing said silicon substrate into said vacuum chamber;
   ii) biasing said silicon substrate in said vacuum chamber;
   iii) flowing nitrogen into said vacuum chamber;
   iv) igniting a nitrogen plasma in said vacuum chamber while maintaining said flow of nitrogen into said vacuum chamber and while maintaining said bias on said silicon substrate to etch said exposed portion of said blanket layer of silicon oxide; and
   v) extinguishing said nitrogen plasma when sufficient silicon oxide has been etched from said blanket layer of silicon oxide to achieve the desired thickness of said thin goat oxide;
c) removing said bias on said silicon substrate;
d) then, in the same vacuum chamber nitridating the upper surface of said thin gate oxide to form a barrier of nitrogen atoms in the upper surface region of said thin gate oxide by:
   i) flowing nitrogen into said vacuum chamber;
   ii) igniting a second nitrogen plasma in said vacuum chamber while maintaining said flow of nitrogen into said vacuum chamber, but without maintaining a bias on said silicon substrate to therefore nitridate said upper surface of said thin gate oxide;
e) extinguishing said second nitrogen plasma used for said nitridation;
f) forming a thin polysilicon gate electrode over said nitridated gate oxide;
g) doping said polysilicon gate electrode and exposed portions of said silicon substrate with dopant to increase the conductivity of said polysilicon gate electrode and to form source/drain regions in said silicon substrate; and
h) annealing said silicon substrate to activate said dopant in said source/drain regions and to diffuse said dopant throughout said polysilicon gate electrode, whereby said barrier of nitrogen atoms formed by said nitridation of said upper surface region of said thin gate oxide will inhibit passage of said dopant through said barrier further into said thin gate oxide during said annealing; and wherein the same vacuum chamber and flow of nitrogen into said vacuum chamber are used for both the step of forming said thin gate oxide and the step of nitridating the upper surface of said thin gate oxide.

7. The process of claim 6 wherein said second nitrogen plasma is maintained at a power level of from about 250 watts to about 2000 watts.

8. The process of claim 6 wherein said second nitrogen plasma comprises a remote plasma.

9. The process of claim 6 wherein said nitridation process is carried out in said vacuum chamber while maintaining a pressure therein of from about 1 millitorr to about 1000 millitorr.

10. The process of claim 6 wherein said nitridation process is carried out in said vacuum chamber while maintaining a pressure therein of from about 1 millitorr to about 500 millitorr.

* * * * *